United States Patent [19]

Gengel

[11] Patent Number: 5,930,117
[45] Date of Patent: Jul. 27, 1999

[54] HEAT SINK STRUCTURE COMPRISING A MICROARRAY OF THERMAL METAL HEAT CHANNELS OR VIAS IN A POLYMERIC OR FILM LAYER

[75] Inventor: Glenn W. Gengel, Longmont, Colo.

[73] Assignee: Sheldahl, Inc., Northfield, Minn.

[21] Appl. No.: 08/646,522

[22] Filed: May 7, 1996

[51] Int. Cl.⁶ .................................................. H05T 7/20
[52] U.S. Cl. .................... 361/720; 165/185; 174/252; 257/706; 428/901
[58] Field of Search .................................... 165/80.2, 185; 174/16.3, 252; 257/706–707, 712, 713; 361/688, 704–709, 712–713, 717–722, 749, 751; 428/137, 209, 901

[56] References Cited

U.S. PATENT DOCUMENTS

| | | | |
|---|---|---|---|
| 3,672,986 | 6/1972 | Schneble, Jr. et al. | 117/212 |
| 4,541,559 | 9/1985 | O'Brien | 228/117 |
| 4,731,701 | 3/1988 | Kuo et al. | 361/388 |
| 4,737,395 | 4/1988 | Mabuchi et al. | 428/138 |
| 4,739,448 | 4/1988 | Rowe et al. | 361/386 |
| 4,744,008 | 5/1988 | Black et al. | 361/386 |
| 4,861,641 | 8/1989 | Foster et al. | 428/137 |
| 4,942,076 | 7/1990 | Ramachandra et al. | 428/137 |
| 4,948,965 | 8/1990 | Feller | 250/207 |
| 4,959,900 | 10/1990 | Givy et al. | 29/840 |
| 5,026,748 | 6/1991 | Adams et al. | 524/66 |
| 5,045,921 | 9/1991 | Lin et al. | 357/74 |
| 5,113,315 | 5/1992 | Capp et al. | 361/700 |
| 5,172,301 | 12/1992 | Schneider | 361/386 |
| 5,214,000 | 5/1993 | Chazan et al. | 437/209 |
| 5,232,970 | 8/1993 | Sole et al. | 524/404 |
| 5,285,352 | 2/1994 | Pastore et al. | 361/707 |
| 5,376,587 | 12/1994 | Buchmann et al. | 437/209 |
| 5,411,077 | 5/1995 | Tousignant | 165/104.33 |
| 5,414,299 | 5/1995 | Wang et al. | 257/702 |
| 5,436,062 | 7/1995 | Schmidt et al. | 428/209 |
| 5,455,739 | 10/1995 | Barden | 361/719 |
| 5,471,366 | 11/1995 | Ozawa | 361/704 |
| 5,477,409 | 12/1995 | Sayka | 361/103 |
| 5,513,070 | 4/1996 | Xie et al. | 361/720 |

FOREIGN PATENT DOCUMENTS 4-99051 3/1992 Japan.
WO 94/25984 10/1994 Japan.

*Primary Examiner*—Gregory D. Thompson
*Attorney, Agent, or Firm*—Merchant, Gould, Smith, Edell, Welter & Schmidt

[57] ABSTRACT

A printed circuit, chip carrier or other substrate for an electronic power circuit can comprise a heat transfer device engineered to dissipate heat generated from the electrical operation of the circuit. The heat transfer characteristic or heat sink capacity of the device results from formation in a polymer film of an array of cylindrical metallic portions in the film that draw heat from the circuit package. We have found that by forming such an array of metallic cylinders wherein each cylinder has a diameter less than about 25 μm, the array defined by a distance on center of about 50–125 μm has a substantial heat transfer characteristic. We have found that when the polymer film has the array of metallic cylinders within the film to a degree that at least about 8%, preferably 10–15% of the surface area of the film is occupied by the metallic cylinder, that the heat transfer characteristics of the film is virtually identical to copper metal. The surprisingly high heat transfer characteristics of the film is surprising and unusual when considering the heat transfer characteristics of the polymeric material surrounding the relatively small proportion of metal. The metallic cylinders are the preferred structure of the metallic portions in the film, however, such cylinders can have some variation of the cylinder structure. Further, any regular array of the cylinders in the film can be used.

20 Claims, 1 Drawing Sheet

HEAT SINK STRUCTURE COMPRISING A MICROARRAY OF THERMAL METAL HEAT CHANNELS OR VIAS IN A POLYMERIC OR FILM LAYER

FIELD OF THE INVENTION

The invention relates to a chip carrier, a printed circuit, or other such device formed in a polymeric film. The device displays enhanced heat conductivity, heat transfer or heat sink characteristics. The metallic portions or thermal channels formed in the film, including circuit lines and paths, planar metal portions and cylindrical metal portions, can be formed by filling holes or vias with metal. A critical configuration of thermal channels cooperates with these circuit components to form a heat transfer device or heat sink structure in and on the film that is highly effective for removing heat from a power generated circuit.

BACKGROUND OF THE INVENTION

Flexible circuitry made using (e.g.) polyester or polyimide film can comprise the thinnest circuit manufactured in the electronic industry. Polymer dielectrics are used with minimum thickness for heat management purposes. However, even thin organic films can have substantial resistance to thermal transfer. Organic dielectrics have a relatively low thermal conductivity (less than about 0.5 watt·m$^{-1}$·K$^{-1}$). Certain other dielectrics, such as ceramics, tend to have substantially higher heat transfer characteristics, but have significant manufacturing and operating drawbacks.

| Thermal Transfer for Certain Electronic Materials | |
| --- | --- |
| Material | Thermal Conductivity (Watt m$^{-1}$ K$^{-1}$) |
| Aluminum | 236 |
| Polyimide | 0.15 |
| Acrylic Adhesive | 0.20 |
| Copper | 398 |
| Alumina | 20 |
| Beryllium Oxide | 275 |

Heat transfer is a very important engineering problem in modern circuit design. The reduction of thermal-mechanical stress in thermally active circuit environments is important. For example, thermal stress is one of the most serious causes of solder joint failure in application of electronic technology. With the accelerated rate of electronic technology advancements, the active electronic circuits installed in a variety of harsh environments are exposed to severe thermal stress. Such environments include airliners, automobiles, life support systems, missile guidance and control systems, lap top computers, etc. In a thermally active environment, greater thermal stresses in combination with a rigid printed circuit board promotes circuit failure. A clear need exist to increase the thermal transfer characteristics of the flexible films used in circuit board manufacture.

Conventional heat sink technology involves attaching a power dissipating active circuit to a heat sink. The circuit is commonly attached to the heat sink through a dielectric to ensure appropriate electrical isolation. The dielectric layer is selected with thermal transfer characteristics such that the power generated by the circuit can be adequately removed to ensure proper circuit function over the lifetime of the device. One important thermal transfer rate limiting barrier comprises typically the dielectric film forming the chip carrier, printed circuit board or other polymer layer mechanically supporting the power circuit, or integrated circuit chip. In large part in the past, the engineering focus on improving thermal transfer characteristics of flexible films has been directed to either reducing the thickness of the film or using a more conductive organic or mixed organic/inorganic chemical composition in the film. Thin films tend to dissipate heat more rapidly than thick films. Further, a variety of films have been manufactured with both organic and inorganic materials in the film that provide greater heat transfer characteristics to the film. However, these engineering solutions to heat transfer characteristics do not provide heat transfer characteristics optimized to the level of a metal layer.

Accordingly, a substantial need exists for forming in a flexible layer, in the form of a chip carrier, flexible printed circuit board, etc., a heat sink or a thermal transfer device that can be used in combination with an external heat sink to remove heat from an active power generating circuit. This need includes a requirement that the film portion of such a circuit construction provides heat conductance substantially greater than that present in current available polymeric films to the degree that the thermal characteristics of the film approaches metal thermal conductivity.

BRIEF DESCRIPTION OF THE INVENTION

We have found that a polymeric film can be made into a highly effective heat transfer device by forming a particular metallic array structure in the film. We have found that by replacing portions of the film with an array of metallic or metal filled thermal channels that the portion of the film including the array can be equivalent to a solid metal slug, having the same dimension as the array, in thermal characteristics. We have surprisingly found that by introducing into the film a regular array of metallic thermal channels, that transfer heat from one surface of the film to the other surface of the film, can approximate thermal conductivity as a copper layer if the thermal channels occupy greater than about 8, preferably greater than 10%, preferably about 12–15% of the area of the film. The thermal channels can have virtually any cross-sectional shape (conical or tapered) and can be arranged in virtually any arbitrary array or arrangement as long as the array occupies greater than 10% of the surface of the film. A regular square or rectangular array is most easily manufactured and is easily adapted to circuit fabrication.

In a preferred mode, a thin flexible polyimide or polyester film is processed to introduce apertures in the film having a diameter that approximates the diameter of the desired thermal channels using available hole drilling technology. The apertures are introduced in the film in a regular or random array. The film is metallized using vapor metallization or other metal forming techniques, including sputtering, electroplating, etc., that can coat the film with copper where needed and can fill the holes with (e.g., copper) metal forming the solid metal thermal channels. Once filled with copper, the thermal channels formed in the film extending from one surface of the film to the other surface of the film occupying greater than 10%, preferably greater than 12% of the film surface is, on a thermal basis, virtually identical to a solid copper portion having a size substantially coextensive to the array geometry. The array can be formed in the film in conjunction with other circuit lines, pads or other components. Either or both sides of the film apart from the array can contain copper circuit lines, patterns, paths or other common printed circuit board structures to aid in circuit and device assembly. At least one side of the film should contain a mounting location for a power circuit coextensive with the array, the power circuit including a power transistor integrated circuit, a flip chip, a wire bonded integrated circuit or other heat generating circuits. Such a mounting location can contain solder pads, wire bonding junctions and other electrical structures useful in circuit formation.

DETAILED DISCUSSION OF THE INVENTION

Figure 1:
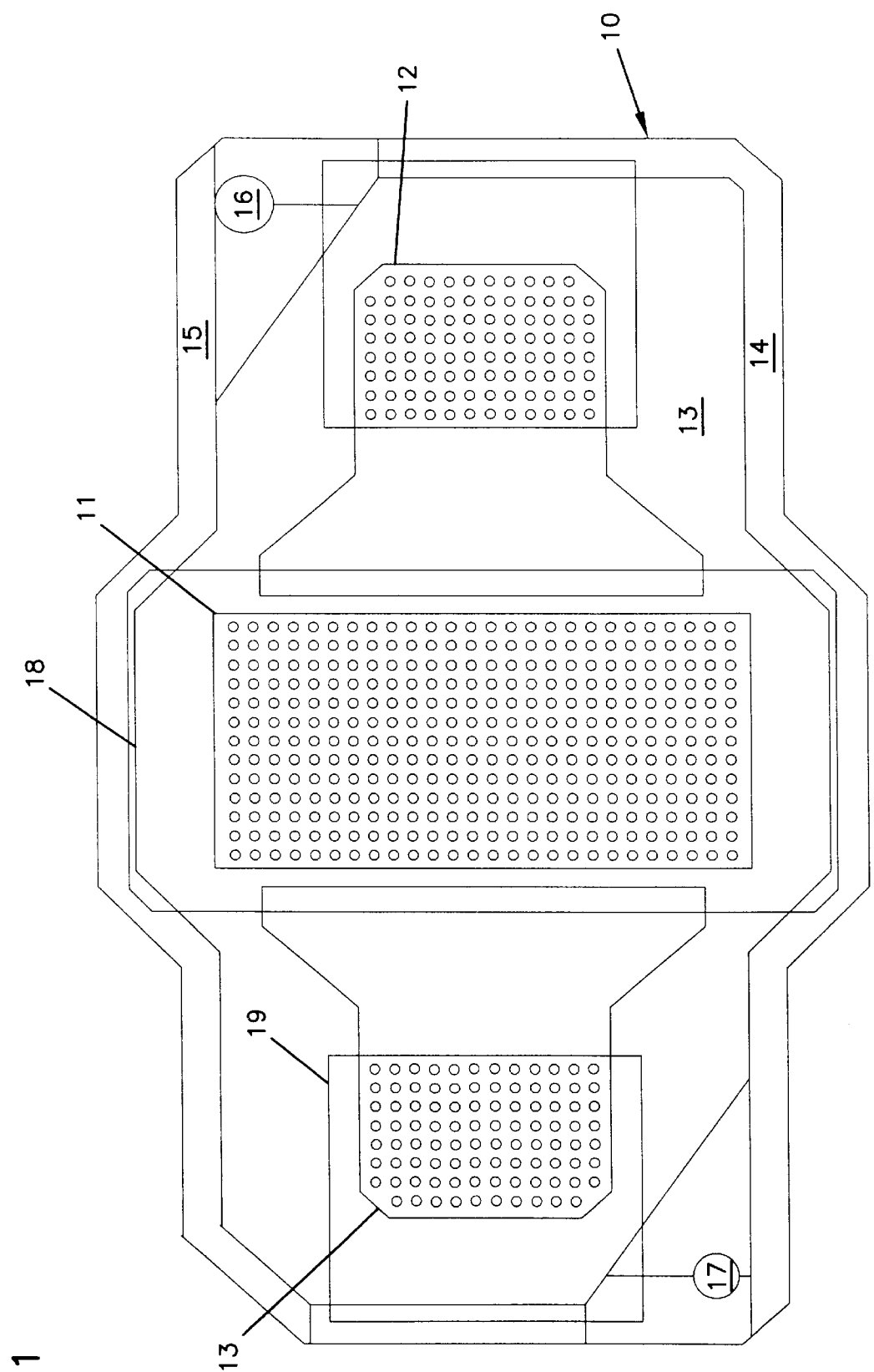
FIG. 1 is a plan view of a preferred heat transfer device of the invention. The device has three zones. The large center zone is configured to be coextensive with the periphery of a wire bonded integrated circuit package that can be attached to the device. The device format can be used to dissipate heat from both sides of the integrated circuit package. This integrated circuit carrier can be used in the assembly of larger circuit components involving electrical and thermal connection to other printed circuit boards, heat sinks and other structures.

Briefly, the invention resides in a polymer film having an array of solid metal thermal channels extending from one surface of the film to the other. The array is formed in either a regular or irregular distribution of the metal channels in the polymer film. The array occupies greater than 10%, preferably greater than 12% of the surface of the film. The individual metal channel can have an arbitrary cross-section, however, is preferably circular in cross-section with a diameter of less than about 25 $\mu$m, preferably about 10–25 $\mu$m. The distance on center between adjacent channels is about 50–150, preferably 60–75 $\mu$m. A preferred thermal device of the invention comprises thermal channels in the film in a regular array pattern.

The second aspect of the invention is a process for forming the solid metal thermal channels. In the process of the invention, holes are introduced into a film using commonly available hole formation techniques including laser drilling, mechanical drilling, perforation, plasma, etc. The film can then be treated conventionally to form metal on the surface of the film and in the apertures. Metal forming techniques are used such that the apertures are filled with solid metal thermal channels that extend from one surface of the film to the other surface.

In our development of the thermal transfer device of the invention, we have found that the portion of the film containing the array of thermal channels is thermally substantially identical to a solid copper slug having the same dimensions as the portion of the film containing the array. In the assembly of an active device, a chip can be adhesively bonded to the thermal array. Alternatively, the chip can be solder bonded to the array using conventional soldering techniques, flip chip packaging with solder bumps or other chip packaging techniques. One common assembly technique is to adhesively join or solder an integrated circuit package to the thermal array and then complete circuit assembly using wire bonding techniques from the chip to active circuit components.

The chip and the thermal transfer device is commonly placed within an active circuit in close association with a heat sink. The chip and thermal array can be directly attached to an electrically isolated heat sink device or can be attached to a circuit that is associated with a heat sink for appropriate thermal management.

Film Substrate Materials

Films that can be used for forming the metal film thermal array of the invention are commonly organic film-forming compositions that can be formed from a variety of common polymeric films including addition polymers, condensation polymers, natural polymers, treated films, thermosetting or thermoplastic resins. Useful films have a thickness of about 10–125 $\mu$m, preferably 25–75 $\mu$m.

Useful thermosetting resins include phenolic resins, phenol-aldehyde resins, furan resins, amino-plast resins, alkyd resins, allyl resins, epoxy resins, epoxy prepregs, polyurethane resins, thermosetting polyester resins, polyimide bis-maleimide resin, polymaleimide-epoxy resin, polymaleimide-isocyanate resin, silicone resins, cyanate resins, a cyanate-epoxy resins, a cyanate-polymaleimide resins, and a cyanate-epoxy-polymaleimide resin; thermosetting so-called "IPN" as obtained by compounding the above thermosetting resins and engineering plastics such as polyamide (Nylon), aromatic polyester, polyetherimide, polyetherether ketone, polysulfone, and polyphenyleneether, and further adding a catalyst; crosslinkable resins obtained by compounding an organic peroxide as a crosslinking agent and a radical polymerizable polyfunctional compound, a thermosetting resin and the like to resins. Because of the nature of thermosetting resins, they cannot be further heat processed without severe distortion or destruction.

Polyimide film can be used in the preferred film thermal array. Preferred polyimides are typically made by a two step reaction involving contacting a tetrabasic acid dianhydride with an aromatic diamine giving first a polyamic acid which is then converted by heat or catalyst into a high molecular weight, linear polyimide. Such polyimides are easily produced as film or sheet.

Thermoplastic resins are also useful in the thermal array films of the invention. Useful addition polymers include poly alpha-olefins, polyethylene, polypropylene, poly 4-methyl-pentene-1, ethylene/vinyl copolymers, ethylene vinyl acetate copolymers, ethylene acrylic acid copolymers, ethylene methacrylate copolymers, ethylmethylacrylate copolymers, etc.; thermoplastic propylene polymers such as polypropylene, ethylene-propylene copolymers, etc.; vinyl chloride polymers and copolymers; vinylidene chloride polymers and copolymers; polyvinyl alcohols, acrylic polymers made from acrylic acid, methacrylic acid, methylacrylate, methacrylate, acrylamide and others. Fluorocarbon resins such as polytetrafluoroethylene, polyvinylidene fluoride, and fluorinated ethylene-propylene resins. Styrene resins such as a polystyrene, alpha-methylstyrene, high impact polystyrene acrylonitrile-butadiene-styrene polymers and others and reinforced materials obtained by compounding glass, carbon, alumina, other fibers, fiber cloth, powder and other fillers to the above polymers of these, those having a glass transition temperature of at least 160° C. are preferred. In particular, polymers having a glass transition temperature of at least 140° C. and preferably a $T_g$ of 180° C. or more is preferred in that the metal treatment or forming conditions used during the formation of the copper film can be chosen from a wider range.

A variety of condensation polymers can also be used in the manufacture of the thermal array of the invention including nylon (polyamide) resins such as nylon 6, nylon 66, nylon 10, nylon 11, nylon 12, etc. A variety of polyester materials can be made from dibasic aliphatic and aromatic carboxylic acids and di or triols. Representative examples include polyethylene-terephthalate, polybutylene terephthalate and others.

Polycarbonates can also be used in the manufacture of the invention. Such polycarbonates are long chained linear polyesters of carbonic acid and dihydric phenols typically made by reacting phosgene ($COCl_2$) with bisphenol A materials resulting in transparent, tough, dimensionally stable plastics. A variety of other condensation polymers are used including polyetherimide, polysulfone, polyethersulfone, polybenzazoles, aromatic polysulfones, polyphenylene oxides, polyether ether ketone and others.

Preferred material for use in the thermal array of the invention are polyester film materials such as polyethyleneterephthalate, polybutylene terephthalate and polyimide materials. These film materials are sold by dupont, Allied-Apical, Teijin, Kanega-fuchi, as Mylar®, Kapton®, Apical®, Upilex®, etc., films.

Metals

The metal useful in forming the thermal array of the invention are metals commonly found in the flexible printed circuit applications of the invention including packaging insulation, labels, decorative layers, anti-static films or reflective layers, etc. Such layers are often shiny, metallic layers not subject to substantial corrosion from atmospheric conditions and have substantial electrical conductivity. Preferred metals for use in forming the thermal array structures of the invention include aluminum, copper, gold, silver, etc.

Hole Formation

An initial step in processing film to form the array of thermal channels involves a first formation of an array of apertures or holes in the film. The preferred hole dimensions are less than about 50 $\mu$m, preferably about 15 to 30 $\mu$m, most preferably greater than about 20–25 $\mu$m. Holes of such dimension are preferably formed using laser drilling techniques. However, other conventional drilling techniques can be used such as twist drills, punching apparatus, surface laminar, photo via, etc.

Preferably, a high power laser is used that can rapidly perforate the film and rapidly create a large number of holes in the desired array. One preferred method of laser through hole drilling formation is shown in Gengel et al., U.S. Ser. No. 08/607,380, filed Feb. 27, 1996 which is commonly assigned. The laser drilling technology of the invention should provide the laser drilled holes in a desirable array ready for further metallization processing. The size of the laser drill holes will govern the diameter of the thermal channels in the array.

Once the holes are formed in the polymer film layer, the polymer film can be treated to a plasma treatment as disclosed in Swisher, U.S. Pat. Nos. 5,112,462, 5,137,791, 5,364,707 and 5,480,730. Such plasma treatment prior to further metallization obtains a substantial peel strength such that the copper is firmly adhered to the polymer layer.

The polymer film is then contacted with further metallization steps and lastly is plated to ensure that the thermal channels comprise a solid metal portion filling the hole from wall to wall and from polymer surface to opposite surface.

Metallization

The plasma treated film is then contacted with a source of a conductive metal vapor. Preferably, a source of metal vapor is used to form a metallized layer on the plasma treated film. Vapor metallization is a low pressure, high temperature (energy) process in which metal vapor is formed. A variety of other layers can be used including carbon, conductive polymers, etc.

Vapor metallization occurs in three basic modes. First, metal wire can be directed into a hot boat or other container at high temperatures and low pressures wherein the metal melt formed in the boat is converted into vapor. Secondly, electron beam excitation of a metal held at low pressure and approximately ambient temperature can cause the production of a pool of molten metal and a metal vapor. Thirdly, the induction heating of metal in a susceptor vessel can result in the production of useful quantities of metal vapor at low pressure.

In common vapor metallization processes, metal is vaporized at a rate sufficient to maintain a substantial quantity of vapor in the treating area. At pressures common in a vapor metallization chamber, metal deposits can be formed at a rate of about 100,000 to 300,000 angstroms per minute. The high energy metal vapor when contacted by organic film layers condenses on the film and bonds to the substrate forming a thin metallized layer with a characteristic thickness of about 50 to 500 $\mu$m, preferably about 100 to 300 $\mu$m. Pressures common in vapor metallization chambers are less than about 0.6 mTorr and are preferably about 0.1 to 0.3 mTorr or less.

The chamber can optionally contain a metal sputtering station used to sputter a second metal layer on the plasma treated surface prior to metallization.

Sputtering

Sputtering is a material transportation phenomenon caused by energetic ions striking a cathode causing the material making up the cathode to be transferred to a different surface through a momentum transfer mechanism. In the performance of a sputtering technique, the substrate to be coated is placed adjacent to a cathode made of the substance which will form the coating. The cathode is subject to a high negative voltage and is placed in an inert gas atmosphere at low pressure. Under the influence of the high voltage potential difference, atmospheric ions are accelerated against the surface of the cathode wherein the momentum of the ions is transferred to atoms on the surface of the cathode, ejecting the atoms from the surface of the cathode and causing them to contact and adhere to the adjacent substrate. Such sputtering process parameters which affect the sputtering rate include mass and energy (accelerating voltage) of the impinging ions; gas temperature; electrode spacing; material and crystalographic orientation of the cathode; cathode surface (containment layers) and cathode shape and shielding. Inert gases useful for such sputtering techniques include helium, neon, argon, krypton, xenon, nitrogen, etc.

We have found in many films, preferably in polyimide films, that a sputtering step, performed after the metal oxide/plasma step, can also significantly increase adherence of the metal layers and channels.

The plasma treatment, sputtering and metallization steps are each carried out at relatively low pressure, typically less than 200 mTorr. These processes can be carried out in a single chamber which is divided into sections operated at a pressure that is optimized for each step. Typically, the metallization occurs at pressures less than 0.5 mTorr, the sputtering occurs at pressures less than 30 mTorr, while the plasma treatment occurs at pressures between 30 and 200 mTorr.

Formation of Further Metal Layers

The plasma treated, metallized or sputtered film is particularly suited for the subsequent formation of thick metal layers and the formation of solid thermal channels such as those useful in the end uses discussed above by plating the holes or vias sheet (i.e.) filled with metal. Such layers and metal channels can be formed in a variety of techniques, however, electroplating and electroless plating are the most commonly used metal layer formation techniques.

Electro-plating is the electrodeposition of an adherent metallic coating on an electrode surface to form a metal deposit. The electrode surface being treated is made the cathode in an electroplating solution or bath. Such baths are typically aqueous solutions from which metal ions are reduced to base metal by the flow of an electric current through a solution of the metal salt. In performing electroplating of metal on a conductive electrode, the electrode or substrate is often cleaned, rinsed, dipped in acid or is subject to other pretreatment or substrate preparation. In operating electro-plating techniques, the substrate is immersed into a solution and necessary DC power is applied typically from metallic anodes to the substrate cathode. The solutions are often agitated and the temperature current metal concentration and other variables are closely controlled using well known principles.

In the preparation of metal thermal array of the invention, the thermal array metal is typically copper plated onto a substrate and into holes formed in the substrate having a thin metal layer previously prepared using the copper metallization techniques.

Useful copper layers, can also be formed using electroless plating which is the controlled autocatalytic deposition of a continuous film by the interaction, in a solution of metal salt between a metal and a chemical reducing agent. Electroless deposition can give films of metals, alloys, metallic compounds, and composites on both conductive and non-conductive surfaces. Electroless solutions contain a metal salt, reducing agent, a pH adjuster or buffer, a completing agent and one or more additives to control solution stability, film properties, deposition rates, etc. Primarily, nickel, copper, gold and silver are plated using electroless techniques. The advantage of electroless plating is the ability to plate metal on non-conductive or poorly conductive surfaces.

Once the metal layer(s) and thermal channels are formed, a printed wiring board can be made by forming the circuit pattern in metal on the film. The pattern can be formed by an etching process or by a semi-additive pattern plating process. In an etching process, a resist and basic etchant baths are used to selectively remove copper leaving the pattern. Alternatively, a conductive circuit pattern can be formed on the thermal array of the invention using a semi-additive technique. In such a technique, the circuit pattern is formed in a way to significantly reduce the amount of metal removed through an etching step. In the semi-additive technique, after the first metal layer is formed using metallization, a resist is formed on the first layer. The resist leaves revealed, the first metal layer in the pattern of the desired circuit. Onto the revealed pattern is plated a thick, 0.1 to 40 $\mu$m layer of copper using commonly electroplating or electroless techniques. Such plating results in a solid metal filled thermal channel having the dimensions of the drilled hole. The copper layer is thermally connected to the array of thermal channels. The copper layer is preferably coplanar within 5 $\mu$m. After the second metal layer in the desired pattern is complete, the resist can be removed leaving the thick metal pattern and in the areas revealed by the removal of resist, the thin metallized layer. The remaining revealed metallized areas are then removed using a light etch. The metallized layers are thin and require brief etching and it substantially reduces the amount of metal removed, the amount of etchant consumed and substantially reduces the amounts of waste materials.

DETAILED DESCRIPTION OF THE DRAWINGS

FIG. 1 is an enlarged plan view of a thermal device of the invention. The overall dimensions of the device is about 2.46 millimeters(mm) (97 mil)×4.12 mm (162 mil). In the device of FIG. 1 are three thermal channel arrays 11, 12 and 13. Array 11 comprises a regular array having a center to center dimension of about 0.0625 mm (2.5 mil) with thermal channels having a diameter of about 0.0254 mm (1 mil). The array in region 11 is 13 channels×26 channels. This array occupies about 12% of the surface of the polymer film. The arrays in regions 12 and 13 have the same center distance and diameter but are arrays that are approximately 8 thermal channels×12 thermal channels. The polymer film 10 is 0.05 mm (2 mil) polyester. Regions 14 and 15 on the film edges are plated to 15 micron copper. Regions 12 and 13 have arrays that are about 0.56 mm (22 mil)×0.81 mm (32 mil). The larger region 11 is an array of 0.9 mm (35 mil)×1.72 mm (68 mil). Mounting apertures 16 and 17 are shown which can be used to mount the thermal transfer device to a circuit, a heat sink, a case or other component of an active circuit device. The thermal device of the invention can have adhered to the thermal arrays chip portions 18 or 19 (shown in outline) for thermal management.

Manufacturing Technique

The thermal transfer devices of the invention are manufactured in relatively large scale roll-to-roll film processing techniques. A large roll of polyester or polyimide film is introduced into a device that can rapidly drill large numbers of precisely located holes having repeatable dimensions in the polymer film. The polymer film is transported through the laser drilling machine at a speed such that the laser can scan the film and form vias or holes at the appropriate locations for array formation. In the film more than one thermal management device can be formed across the width of the film. In small devices having dimensions of about 10×30 millimeters, the film can have a large number of devices across the width of the film. Larger devices take up larger areas and can be formed in reduced numbers across the polymer film width.

After the holes are drilled in the polymer film, the film can be metallized. Optionally, prior to metallization, the plasma treatment disclosed in Swisher, U.S. Pat. Nos. 5,112,462, 5,137,791, 5,364,707 and 5,480,730 is used to prepare the film for further metallization. The plasma treated film can be metallized with copper or other metal layers using a single metal layer or multiple layers prior to final plating. 100 Å formed by vapor metallization followed by a copper layer formed on the chromium layer having a thickness of about 50 to 5000 Å followed by an electro-plated copper layer having a dimension of about 0.1 to about 40 microns.

In any final plating step in processes used to make the solid thermal channels of the invention, the electro-plating step completes the filling of any space remaining in the vias not filled by metallization, sputtering or other metal forming step.

Experimental and Data Section

A thermal transfer device substantially similar to that shown in FIG. 1 was prepared having thermal channels with a diameter of about 0.0254 mm (1 mil) on 0.0635 mm (2.5 mil) centers was formed in a 0.051 mm (2 mil), an integrated circuit chip (a radio frequency chip with a 5–10 watt power output) was adhered to the larger central array shown in FIG. 1. The chip was connected to the peripheral smaller arrays and the thermal characteristics of the assembly were measured. The average temperature of the chip and the junction temperature of the chip was measured. The following Tables 1–3 show, respectively, the temperatures measured using a film made without the use of any thermal channels in the polymer film. In particular, the high temperatures of the smaller peripheral circuit portions U2 and U3 (U1 is the larger central region) are shown.

TABLE 1

Polyimides
Report Components

| Ref | T avg | T jun |
|---|---|---|
| U1 | 88.100 | 88.900 |
| U2 | 208.400 | 211.000 |
| U3 | 200.400 | 203.000 |

In Table 2, a test device manufactured using a solid copper portion coextensive with the integrated circuit was used as a heat sink substituted for the formation of an array of thermal channels in the polymer film. The temperatures of the integrated circuit operated under controlled conditions is shown in Table 2.

TABLE 2

Solid Copper
Report Components

| Ref | T avg | T jun |
|---|---|---|
| U1 | 55.100 | 55.800 |
| U2 | 119.900 | 122.300 |
| U3 | 120.200 | 122.600 |

TABLE 3

Thermal Channels
Report Components

| Ref | T avg | T jun | (Rows × Cols.) |
|---|---|---|---|
| U1 | 53.200 | 54.000 | 25 × 40 |
| U2 | 111.300 | 113.800 | 10 × 8 |
| U3 | 111.200 | 113.700 | 10 × 8 |

Table 3 shows the temperature of the chip and junction when operated under controlled conditions. A comparison of Table 2 to Table 3 shows that the use of an integrated circuit chip carrier having a thermal array as described in this invention has a lower operating temperature than the chip in contact with the solid copper slug.

The above figures, description, experimental and data section provide a basis for understanding the invention as disclosed. However, since the invention can contain a variety of embodiments, the invention resides in the claims hereinafter appended.

I claim:

1. A heat transfer device comprising:
   a polymeric film having a thickness of about 10–125 μm, and
   an array of cylindrical metal portions formed in a plurality of film apertures, the array configured and arranged for dissipating heat from a power circuit, the cylindrical metal portions having a diameter of less than about 25 μm, the array defined by an on center spacing of about 50–150 μm, and the cylindrical metal portions comprising greater than 8% of the surface of the film.

2. The device of claim 1 wherein the array is configured and arranged for dissipating heat from an integrated circuit package.

3. The device of claim 2 wherein the array is configured and arranged for dissipating heat from a wire bond integrated circuit chip.

4. The device of claim 2 wherein the array is configured and arranged for dissipating heat from a flip chip integrated circuit.

5. The device of claim 1 wherein the array is arranged to form a rectangle comprising at least eight metal cylinders by at least 12 metal cylinders, the array having an oncenter spacing of about 50–65 μm and the array comprising about 12–15% of the film surface.

6. The device of claim 1 wherein the polymer film has a thickness of less than about 75 μm.

7. The device of claim 1 wherein a surface of the film has a copper layer formed thereon, the copper layer having a thickness less than about 40 μm and thermally connected to the array.

8. The device of claim 1 wherein the metal comprises copper and the each cylindrical metal portion is solid.

9. The device of claim 1 wherein the array is not electrically connected to an active electrical circuit.

10. The device of claim 2 wherein the array is configured and arranged to be substantially coextensive with the integrated circuit package.

11. The device of claim 1 wherein the cylindrical portions are tapered.

12. The device of claim 7 wherein the copper layer is coplanar within 5 μm.

13. The device of claim 1, wherein the array of cylindrical metal portions can dissipate heat during the operation of a power circuit at least as well as a copper block of similar dimensions.

14. The device of claim 1, wherein the device further comprises a circuit pattern on at least one surface of the polymeric film providing at least one circuit path for the power circuit.

15. A process for manufacturing a heat transfer device that can dissipate heat generated from the operation of a power circuit, the process comprising:
   (a) forming, in a polymeric film having a thickness of about 10 to 125 μm, a plurality of apertures having a diameter of about 10 to 25 μm in an array, said array occupying greater than 10% of the surface of the polymeric film;
   (b) metallizing the polymeric film and the plurality of apertures to form a metal layer having a dimension of up to 100 angstroms; and
   (c) filling in the plurality of apertures with metal forming a solid metal channel within each of the plurality of apertures.

16. The process of claim 15 wherein the array is a regular array of at least 8 apertures×10 apertures having an on center dimension of about 50–125 μm.

17. The process of claim 15 wherein the metal comprises copper.

18. The process of claim 15 wherein prior to the metallization step, the film is treated with a plasma.

19. The process of claim 15 wherein the film has a thickness of 75 μm or less.

20. The process of claim 15 wherein the apertures are filled by electroplating the polymer layer.

* * * * *